United States Patent
Dehkordi et al.

(10) Patent No.: US 10,151,789 B2
(45) Date of Patent: Dec. 11, 2018

(54) METHOD AND DEVICE FOR TESTING THE CONNECTIONS OF BATTERIES

(71) Applicant: Acculogic Corporation, Markham (CA)

(72) Inventors: Karim Dehkordi, Lake Forest, CA (US); Paul Bennett, Lake Forest, CA (US); Greg Leblonc, Markham (CA); Farokh Eshragi Azar, Markham (CA); Farhad Fahimi, Markham (CA)

(73) Assignee: ACCULOGIC CORPORATION, Markham, Ontario (CA)

( * ) Notice: Subject to any disclaimer, the term of this patent is extended or adjusted under 35 U.S.C. 154(b) by 0 days.

(21) Appl. No.: 15/309,908

(22) PCT Filed: Jan. 11, 2016

(86) PCT No.: PCT/IB2016/000304
§ 371 (c)(1),
(2) Date: Nov. 9, 2016

(87) PCT Pub. No.: WO2016/128837
PCT Pub. Date: Aug. 18, 2016

(65) Prior Publication Data
US 2017/0269142 A1    Sep. 21, 2017

Related U.S. Application Data

(60) Provisional application No. 62/113,788, filed on Feb. 9, 2015.

(51) Int. Cl.
*G01R 31/04* (2006.01)
*G01R 31/36* (2006.01)
*H01M 2/20* (2006.01)

(52) U.S. Cl.
CPC ......... *G01R 31/04* (2013.01); *G01R 31/3627* (2013.01); *G01R 31/3662* (2013.01); *G01R 31/36* (2013.01); *H01M 2/20* (2013.01)

(58) Field of Classification Search
CPC .......................... G01R 31/04; G01R 31/3662; G01R 31/3627; G01R 31/36
(Continued)

(56) References Cited

U.S. PATENT DOCUMENTS

| | | | |
|---|---|---|---|
| 4,468,741 A * | 8/1984 | Simonton | G05B 19/41815 228/58 |
| 4,697,134 A | 9/1987 | Burkum et al. | |

(Continued)

FOREIGN PATENT DOCUMENTS

| | | |
|---|---|---|
| GB | 2109564 A | 6/1983 |
| JP | S63079075 A | 4/1988 |

(Continued)

*Primary Examiner* — Patrick Assouad
*Assistant Examiner* — Khristopher Yodichkas
(74) *Attorney, Agent, or Firm* — Rankin, Hill & Clark LLP

(57) ABSTRACT

For testing the connections (13) of batteries (8) that are connected in a battery module (5) to several bus bars (6, 7) that are electrically in parallel with their battery electrodes (10, 11) by a resistance measurer (16) comprising a pair of contact pins (17, 18), during a measurement a first batten' electrode (10) is contacted by a first contact pin (17) and a point on the conductor arrangement (13, 6, 13, 10) connected to the first battery electrode (10) is contacted by the second contact pin.

3 Claims, 4 Drawing Sheets

(58) Field of Classification Search
USPC .......................................................... 324/430
See application file for complete search history.

(56) References Cited

U.S. PATENT DOCUMENTS

| | | | |
|---|---|---|---|
| 6,906,523 B2 * | 6/2005 | Bertness | G01R 31/3662 |
| | | | 324/426 |
| 9,490,465 B2 * | 11/2016 | Jan | H01M 2/206 |
| 2009/0104516 A1 | 4/2009 | Yoshihara et al. | |
| 2009/0297892 A1 | 12/2009 | Ijaz et al. | |
| 2010/0028761 A1 | 2/2010 | Bielawski et al. | |
| 2010/0265051 A1 | 10/2010 | Sivertsen | |
| 2012/0164490 A1 | 6/2012 | Itoi et al. | |
| 2012/0280692 A1 | 11/2012 | Park | |
| 2013/0245970 A1 | 9/2013 | Zhang | |
| 2014/0255748 A1 | 9/2014 | Jan et al. | |
| 2014/0278174 A1 * | 9/2014 | Biskup | G01R 27/14 |
| | | | 702/65 |
| 2015/0022228 A1 | 1/2015 | Motohashi et al. | |
| 2016/0093931 A1 | 3/2016 | Rawlinson et al. | |

FOREIGN PATENT DOCUMENTS

| | | |
|---|---|---|
| JP | H03051768 A | 6/1991 |
| JP | H09219187 A | 8/1997 |
| JP | 2004087412 A | 3/2004 |
| JP | 2012034535 A | 2/2012 |
| JP | 2012169244 A | 9/2012 |
| JP | 2014146516 A | 8/2014 |
| WO | 2011072939 A1 | 6/2001 |

* cited by examiner

METHOD AND DEVICE FOR TESTING THE CONNECTIONS OF BATTERIES

CROSS-REFERENCE TO RELATED APPLICATIONS

This application is a U.S. national stage of International Application No. PCT/IB2016/000304, filed Jan. 11, 2016, and claims priority to U.S. provisional Application No. 62/113,788, filed Feb. 9, 2015.

BACKGROUND OF INVENTION

Field of Invention

The invention relates to a method and a device for testing the connections of batteries, several of which in a battery module are connected, electrically in parallel, with their battery electrodes to bus bars.

Brief Description of Related Art

For example, battery modules for electric vehicles can be produced with this technology using commercial lithium ion batteries, for example, in the AA format, that have a parallel arrangement of, for example, 500 batteries. This concerns a parallel circuit of a very large number of batteries. This results in problems in the tests required after the production of the battery module.

The batteries are connected with their battery electrodes to bus bars. The connections can be constructed in many ways, for example, as a direct contact or via connection connectors that are connected, for example, in the form of a wire to the battery electrode on the one hand and to the bus bar on the other hand. These connections must be tested.

The present invention therefore has the problem of creating a method and a device with which the connections of the batteries can be tested.

BRIEF SUMMARY OF THE INVENTION

This problem is solved with a method for testing the connections of batteries, several of which in a battery module are connected, electrically in parallel, with their battery electrodes to bus bars, by means of a resistance measurer comprising a pair of contact pins, in a measurement, with a first contact pin a first electrode being contacted and with a second contact pin a point on the conductor arrangement being connected to the first battery electrode. The problem is also solved with a device for carrying out the method for testing a battery module in which the batteries are arranged in a fixed grid, characterized in that a test head that can move over the grid carries several contact pins arranged so that they fit the grid. In another embodiment, a safety contact pin is connected by a safety resistance measurer to a contact pin of the resistance measurer, wherein the contact pin and the safety contact pin are designed for the simultaneously contacting of the same contactable surface. In another embodiment, a battery module in which at least one of the bus bars is constructed as a plate with holes arranged in a grid under which holes the associated battery electrodes are arranged, and the contact pins are arranged and constructed in such a manner that they extend through the holes for the contacting.

According to the invention the battery module is contacted by a pair of contact pins that are connected to a resistance measurer. Such test devices have proven themselves and can be readily adapted to different test situations, for example, with movable contact pins. The resistance of the connection, for example, of a spring contact or of a soldered or welded connection connector can be checked during the measuring in accordance with the invention with one contact pin on a battery electrode and with the second contact pin on a point on the conductor arrangement connected to the latter, which allows very precise statements about the quality of the connection. A statement about the proper functioning of the battery module can be made in an uncomplicated manner with repeated or parallel measurements on all batteries of the battery module.

All connections can be individually tested by means of a resistance measurer comprising a pair of contact pins, in a measurement, with a first contact pin a first electrode being contacted and with a second contact pin a point on the conductor arrangement being connected to the first battery electrode. For this, a contact pin can be placed, for example, for each battery on its battery electrode and the other contact pin can be placed on the bus bar. The measuring expense can preferably be cut in half when, during the measuring, the second contact pin is contacting a second battery electrode connected to the same bus bar. If during a measuring a contact pin is seated on the battery electrode of a battery and the other contact pin is seated on the battery electrode of another battery, then the complete connecting connection between a battery electrode, the bus bar and the other battery electrode can be determined in a measurement. Therefore, two batteries are included at the same time with practically the same measuring expense. Furthermore, during this type of measuring all contact pins contact identical contacting sites, namely, the battery electrodes, as a result of which the construction of the required test device can be simplified.

During the measuring battery electrodes of adjacent batteries are advantageously contacted. As a result, the conductive connection path between the two contact points is shortened, which increases the measuring accuracy. Furthermore, the required test device can be made smaller since, for example, the required maximal distances between the contact pins are limited. Finally, the advantage of greater clarity and possibilities of simplification result in the control devices and control programs for the contact pins in comparison to a stochastic access method.

If, in a customary manner in each measurement only a pair of contact pins are used, this results in the case of a battery module with several hundred batteries in a significant number of necessary measuring steps, which prolongs the total test time. Therefore, several pairs of contact pins can be advantageously contacted simultaneously. This means a significant saving of time since the travel times of the contact pins always require the greatest expenditure of time. On the other hand, the actual measuring time is usually negligible. If several pairs of contact pins are contacted simultaneously, they can, for example, also be moved simultaneously and the measurements can take place simultaneously, for example, by several resistance measurers operating in parallel or, for example, by a rapid switching of a resistance measurer onto the different pairs of contact pins.

In the case of a battery module in which the batteries are arranged in a fixed grid a test head that can be moved over the grid is advantageously provided that carries several contact pins suitably arranged relative to the grid. In particular in the case of battery modules with very many batteries, the testing can be accelerated in this manner. A testing head can travel from position to position and carry out several measurements in parallel. In the case of a high number of contact pins, the work can be carried out very rapidly in this manner.

A safety contact pin is provided in an advantageous manner parallel to a contact pin which safety contact pin contacts the same surface. The resistance between both contacting positions can be measured. This yields a statement about the quality of the contacting itself. If the contacting quality is also measured during each connection measurement, the measuring quality can be significantly increased.

A battery module can be advantageously tested in which the bus bars are constructed as plates with holes arranged in a grid-like pattern under which the associated battery electrodes are arranged. Here the contact pins are arranged and constructed in such a manner that they reach through the holes for the contacting. This makes possible a simple but precise contacting of the battery electrodes from the free side of the plate-shaped bus bar.

BRIEF DESCRIPTION OF THE DRAWINGS

The invention is shown by way of example and schematically in the drawings. In the drawings.

DETAILED DESCRIPTION OF THE INVENTION

Figure 1:
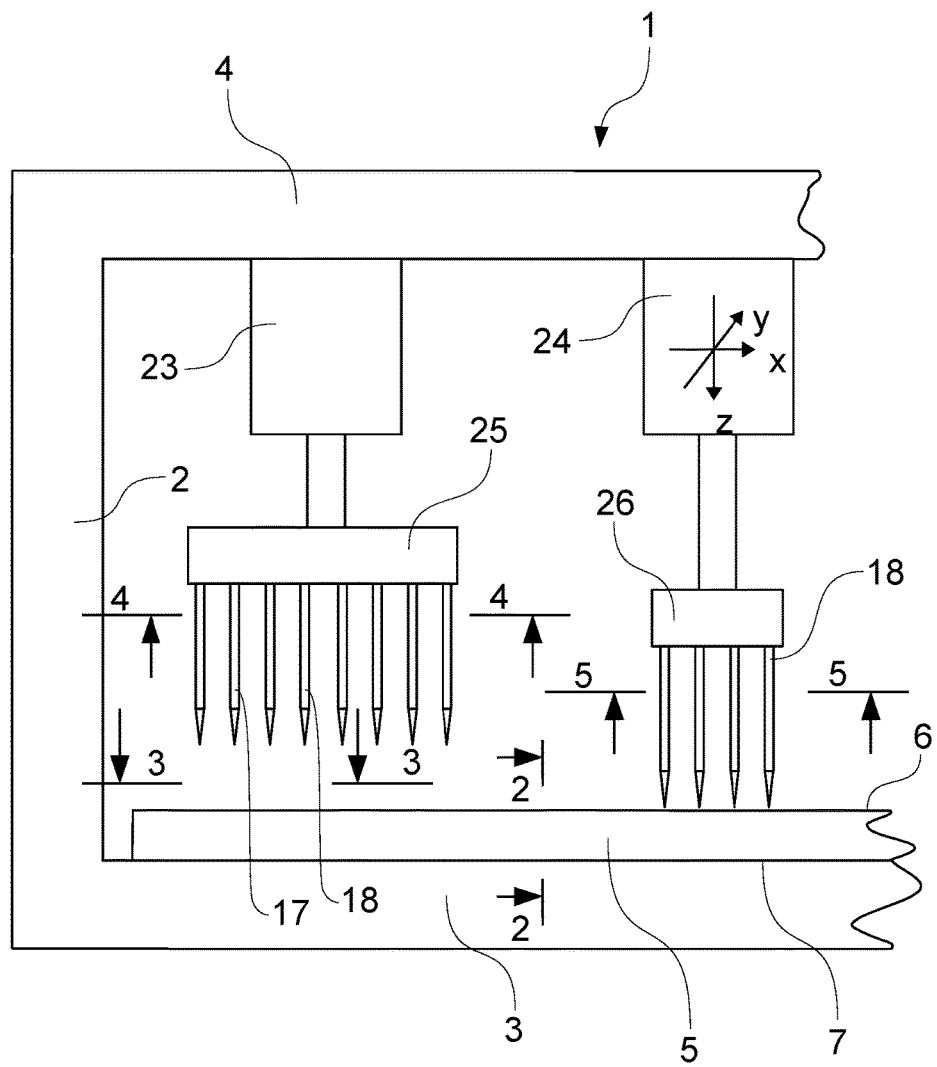
FIG. 1 shows a side view of a device for testing the connections of batteries of a battery module with two test heads.

FIG. 1 shows a side view of a test device 1 with a frame 2 that connects a module carrier 3 to a head carrier 4 and is placed, for example, with the module carrier 3 on a table or floor that is not shown. The module carrier 3 serves to receive the battery module 5 shown in FIG. 1, which is to be subjected to a test.

Figure 2:
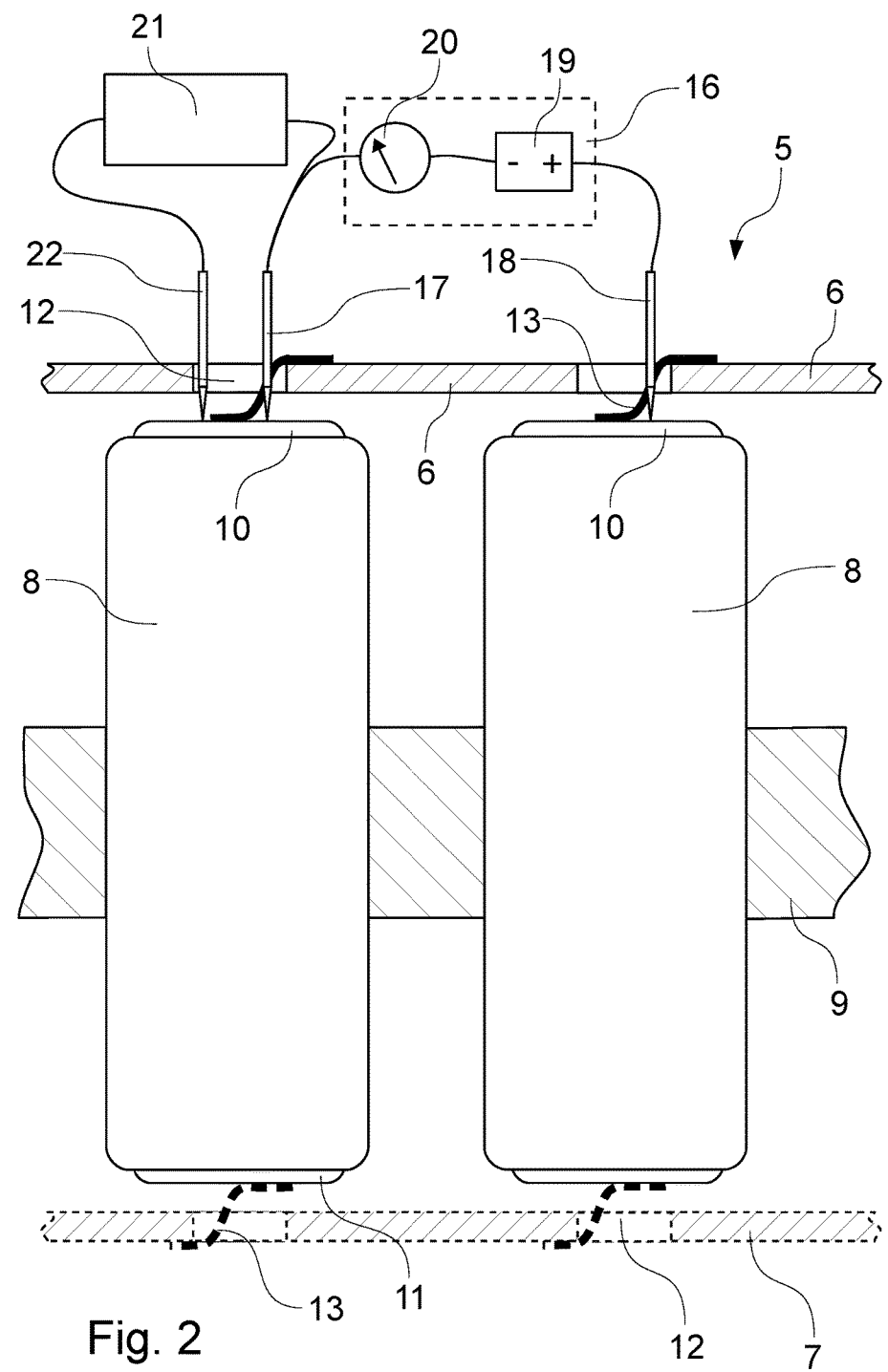
FIG. 2 shows an enlarged section along line 2-2 in FIG. 1 showing two batteries.

FIG. 2 shows a section from the battery module 5 showing a plate-like upper bus bar 6 and a lower bus bar 7 arranged parallel to it. The bus bars 6 and 7 can be constructed to be congruent and identical. A plurality of batteries 8 is arranged between them that are held standing in parallel in a uniform grid. The carrier structure 9 can serve for holding them and secures the position of all batteries among themselves and with the bus bars 6, 7.

The two batteries 8 shown are of the same type, for example, a commercial AA format. They have a longitudinally extended, cylindrical housing on whose ends battery electrodes 10 and 11 are centrally seated.

The battery electrodes 10 and 11 can be constructed to be mechanically identical, as is also shown in FIG. 2. They have a different polarity + and − and are all electrically connected in parallel. To this end the battery electrodes 10 lying toward the upper bus bar 6 and FIG. 2 and which are, for example, the + electrodes, are connected to the upper bus bar 6 and the lower battery electrodes 11 are all connected to the lower bus bar 7. In order to simplify the drawing, in FIG. 2 the electrode connections to the bus bars are only shown for the upper bus bar 6.

The upper bus bar 6 is provided with holes at the locations where the upper battery electrodes 10 are seated. Corresponding holes 12 are also formed in the lower bus bar 7.

Electrically conductive connectors 13 formed, for example, in the shape of wires or bands, are connected by one end to an upper battery electrode 10 and by the other to the upper bus bar 6. The connectors 13 can be constructed here, for example, as a wire that is soldered at its ends to the surfaces of the battery electrode 10 or is connected by spot welding.

The connectors 13 are also to be arranged in a corresponding manner between the lower battery electrodes 11 and the lower bus bar 7. They can have a relatively small cross section since they only have to carry the current of a single battery 8. The bus bars 6 and 7 must also consist of conductive material but require a greater cross section since the current of several batteries flows through them.

Figure 3:
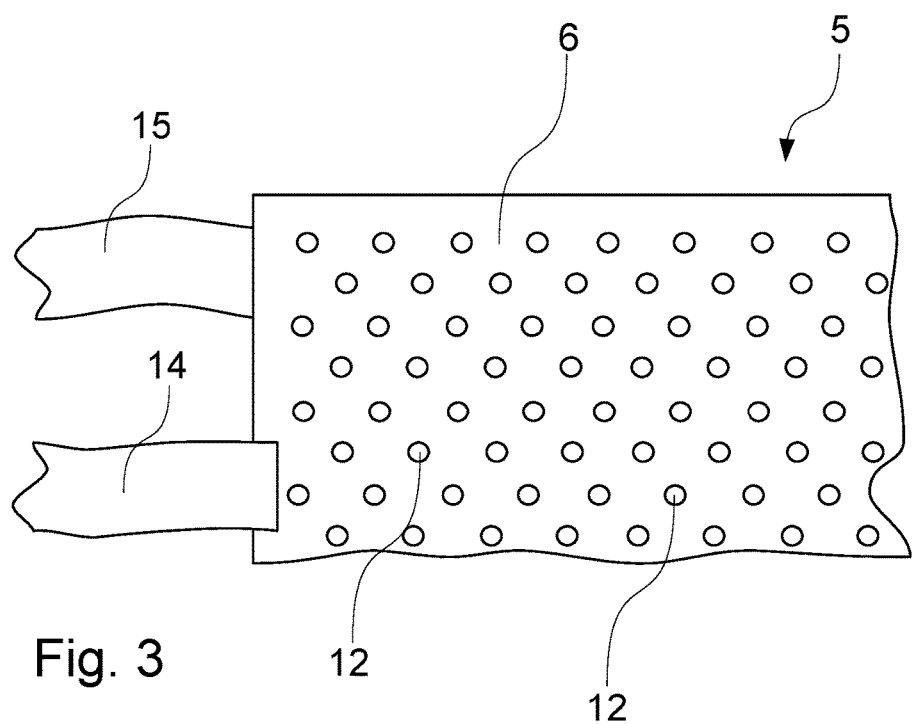
FIG. 3 shows a atop view onto a battery module along line 3-3 in FIG. 1.

FIG. 3 shows a top view onto the battery module 5, the upper bus bar 6 and the holes 12 arranged in them. The holes 12 are arranged in the exemplary embodiment shown in the regular grid shown, in which the batteries 8 and the battery electrodes also stand. Two thick conductor cables 14 and 15 connect the upper bus bar 6 and the lower bus bar 7 to a consumer, for example, a vehicle engine or to control electronics connected in front of the latter.

After the mounting of the battery module 5 it must be tested for manufacturing errors. If it is assumed that the individual batteries 8 were previously tested, then the possibility of errors in the manufacture of the battery module 5 is to be found substantially in the positioning of the connectors 13.

The connectors 13 run in an S shape between the surface of the particular battery electrode 10 and the surface of the upper bus bar 6. Electrically conductive connections must be produced at both ends, for example, by spot welding.

Breaks can occur in a connector 13 or a lacking contact on one of its ends if, for example, a soldering or welding took place in an incomplete manner.

Such errors must be checked for with a test and as rapidly as possible in the case of very many connecting connections, for example, 1,000 connectors in the case of a battery module with 500 batteries.

The good conductivity of the connections between the batteries 8 and the bus bars 6, 7 is important here. A resistance measuring is carried out in order to check them. A resistance measurer is 16 is used for this that is connected by a pair of contact pins 17, 18 to the lines shown in FIG. 2.

The resistance measurer 16 comprises a current source 19 and a current measuring device 20 in a customary construction. Given a known voltage of the current source 19, the display of the current measuring device 20 can be unambiguously re-calculated into the measured resistance value. As FIG. 2 shows, in the exemplary embodiment the resistance is measured on short connections that conduct well. The resistance measurer 16 should therefore be designed in particular especially for the low-ohmic range.

In order to determine whether a connector 13 is whole and correctly connected at both ends, measurements could be carried out, for example, between the two ends of a connector in order to check it for an interruption. Then, a contacting could be made on the connecting conductor and on the other hand on the bus bar in order to test the correct connection of the connecting conductor on the bus bar.

That would mean several measurements for a connector. In addition, there is the fact that the connecting conductor 13 is sensitive and should not be touched if possible. Therefore, the measuring is carried out in such a manner as is shown in FIG. 2, namely, between two battery electrodes of different batteries connected to the same bus bar. In the example of FIG. 2 shown, that is the upper bus bar 6.

As FIG. 2 shows, two batteries 8 are measured on which the upper battery electrodes 10 are contacted by the contact pins 17 and 18. Therefore, a current flow is generated that runs from the one battery electrode through its connector 13, then through the upper bus bar 6 and then through the other connector to the battery electrode 10 of the other battery 8. Therefore, two complete battery connections are measured in series. This cuts the number of measurements and therefore the measuring time in half and optimizes the significance of the measuring.

A poor contacting of one of the contact pins 17, 18 could result in a false measurement. In order to check the reliability of the contacting, a safety measuring is carried out. For this, a safety resistance measurer 21 is provided that can have basically the same construction as the resistance measurer 16. It is connected by the two shown conductors to the contact pin 17 on the one hand and to a safety contact pin 22 on the other hand. It can be determined with this safety arrangement if both contact pins 22 and 17 are set on the same conductive surface of the battery electrode 10 whether the contact pins 17 makes a good contact with the battery electrode 10. If the measured resistance is above a set value, then the contacting of the contact pins 17 is probably insufficient and must be checked.

A corresponding safety circuit with a safety contact pin can also be provided on the contact pin 18 in order to be able to guarantee complete contact safety.

As FIG. 2 shows, the batteries 8 are connected on the bottom to the lower bus bar 7 in an identical manner. Therefore, the tests can take place here in the same manner.

The test device 1 shown in FIG. 1 serves for the testing. It carries the battery module 5 on the module carrier 3. The head carrier 4 carries two head drives 23 and 24 that for their part each carry a test head 25, 26 and can move it in the x, y and z directions in the desired manner.

The test heads 25 and 26 have different sizes and carry a number of contact pins 17, 18. Resistance measurers are connected to the contact pins in a manner that is not shown and are able to determine the resistance between two contact pins. In another embodiment it is also possible to operate all pairs of contact pins with only one resistance measurer that is constructed so that it can be switched between the pairs for this purpose.

Figure 4:
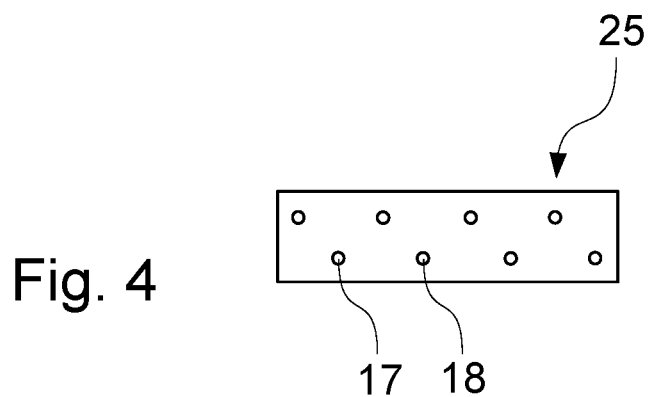
FIG. 4 shows a view of a test head along line 4-4 in FIG. 1.
Figure 5:
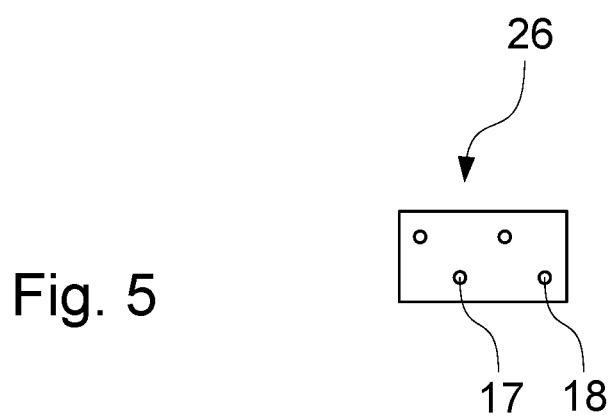
FIG. 5 shows another test head along line 5-5 in FIG. 1.

The test heads 25 and 26 have different sizes, as FIGS. 1, 4 and 5 show. In the exemplary embodiment the test head 25 carries eight contact pins and the test head 26 carries four contact pins.

Figure 6:
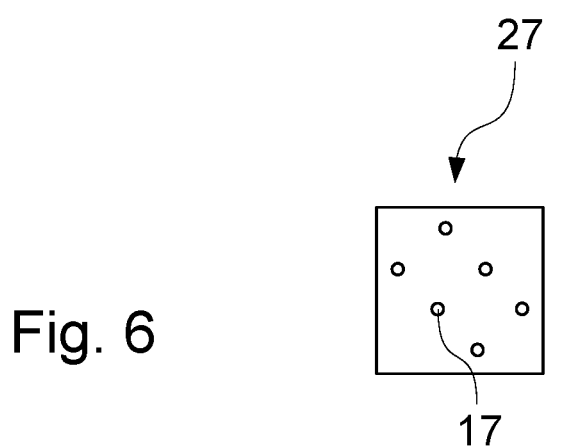
FIG. 6 shows another test head.

FIG. 6 shows a test head 27 with a different pin arrangement. However, the pin arrangements of all heads 25, 26 and 27 shown obviously fit the grid arrangement of the holes 12 of the battery module 5, as is shown in FIG. 3.

FIG. 1 shows the test head 25 in raised position, that is, not contacting, and shows the test head 26 in lowered position, in which the contact pins contact battery electrodes 10 of the battery module 5.

When the top of the battery module 5 has been completely tested, the battery module can be turned around in order to now test the bottom in the same manner.

In the case of a very large battery module 5, test heads 25 with very many pins, for example, the eight pins of the test head 25 shown, can be used. Of course, even much greater test heads can be used in order to further accelerate the testing process.

A test head, for example, the test head 25, can obviously be seen on the surface of the battery module 5 successively in several adjacent positions with contacting of all its contact pins, which makes it possible to achieve a complete engagement of all holes 12. As FIG. 1 shows even test heads 25 and 26 with different sizes can be used. For example, narrow ranges can be tested with the smaller test head 26 that are too narrow for the large test head 25.

In the case that safety contact pins 22 are used, they are to be additionally provided on a test head, which can double the number of contact pins on a test head.

FIG. 2 shows the geometry of the connectors 13 that are arranged in such a manner that they pass through a hole 12 of the bus bar 6. They are sensitive to touch in this area and should not be touched by the contact pins 17, 18. The contact pins 17, 18 and optionally also 22 must therefore be positioned through the hole 12 and adjacent to the connectors 13, that is, in a very narrow area range. The position control of the head drives 23 and 24 is to be constructed in an appropriately precise manner.

LIST OF REFERENCE NUMERALS:

1 Test device
2 Frame
3 Module carrier
4 Head carrier
5 Battery module
6 Upper bus bar
7 Lower bus bar
8 Battery
9 Carrier structure
10 Battery electrode
11 Battery electrode
12 Hole
13 Connector
14 Conductor cable
15 Conductor cable
16 Resistance measurer
17 Contact pin
18 Contact pin
19 Current source
20 Current measuring device
21 Safety resistance measurer
22 Safety contact pin
23 Head drive
24 Head drive
25 Test head
26 Test head
27 Test head

The invention claimed is:

1. A method for testing a quality of electrical connections in a battery module containing a plurality of batteries and a bus bar for connecting electrodes of said plurality of batteries electrically in parallel, wherein the bus bar is a planar plate provided with a plurality of through holes, wherein each battery contained in the battery module has one electrode arranged on each opposing end of the battery, and wherein each battery has one electrode arranged under one of the plurality of through holes provided in the bus bar, said method comprising:

extending a first contact pin of a resistance measurer through one of said through holes in the bus bar such that the first contact pin makes contact with an electrode of one of said plurality of batteries contained within said battery module;

contacting a second contact pin of said resistance measurer with a point on a conductor arrangement, wherein said conductor arrangement includes said bus bar, an electrode of another of said plurality of batteries contained in said battery module, optionally, a connector element extending between said bus bar and said electrode contacted by said first contact pin, and optionally, a connector element extending between said bus bar and said electrode of another of said plurality of batteries contained in said battery module; and measuring electrical resistance between said first contact pin and said second contact pin using said resistance measurer to determine the quality of electrical connections between said electrode contacted by said first contact pin and said point on said conductor arrangement contacted by said second contact pin.

2. A device for carrying out the method according to claim 1 on a battery module containing a plurality of batteries arranged in a fixed grid and a bus bar for connecting electrodes of said plurality of batteries electrically in parallel, wherein the bus bar is a planar plate provided with a plurality of through holes, wherein each battery contained in the battery module has one electrode arranged on each opposing end of the battery, and wherein each battery has one electrode arranged under one of the plurality of through holes provided in the bus bar, the device comprising a test head configured to move over the grid, said test head comprising a resistance measurer carrying a plurality of contact pins arranged to fit the grid, wherein at least a first contact pin carried by the test head is configured to extend through one of said through holes in the bus bar such that the first contact pin is contactable with an electrode of one of said plurality of batteries contained within said battery module.

3. The device according to claim 2, wherein a safety contact pin is connected by a safety resistance measurer to-a one of the plurality of contact pins of the resistance measurer, and wherein said one of the plurality of contact pins connected by the safety resistance measurer to the safety contact pin and the safety contact pin are configured to simultaneously contact a same contactable surface.

* * * * *